United States Patent [19]
Tihanyi

[11] 3,885,993
[45] May 27, 1975

[54] METHOD FOR PRODUCTION OF P-CHANNEL FIELD EFFECT TRANSISTORS AND PRODUCT RESULTING THEREFROM

[75] Inventor: Jenoe Tihanyi, Neuried, Germany

[73] Assignee: Siemens Aktiengesellschaft, Berlin & Munich, Germany

[22] Filed: Jan. 22, 1973

[21] Appl. No.: 325,616

[30] Foreign Application Priority Data
Feb. 21, 1972 Germany.......................... 2208083

[52] U.S. Cl. ................. 148/1.5; 117/201; 148/175; 148/187
[51] Int. Cl. .............................................. H01l 7/54
[58] Field of Search..................... 148/1.5, 175, 187; 117/201; 317/235

[56] References Cited

UNITED STATES PATENTS 3,413,145 11/1968 Robinson et al.................. 117/201
3,424,955 1/1969 Seiter et al...................... 148/175 X

OTHER PUBLICATIONS

Allison et al., "Thin Film Silicon: Etc.," Proc. IEEE, Vol. 57, No. 9, Sept. 1969, pp. 1490–1498.

*Primary Examiner*—L. Dewayne Rutledge
*Assistant Examiner*—J. M. Davis
*Attorney, Agent, or Firm*—Hill, Gross, Simpson, Van Santen, Steadman, Chiara & Simpson

[57] ABSTRACT

A process for the production of a p-channel field effect transistor in a semiconductor layer of silicon disposed on a spinel substrate which includes the step of annealing the substrate as well as the silicon in a hydrogen atmosphere after the formation of the transistor has been completed. The formation of the electrodes and conductors for the field effect transistor may take place either before or after the annealing of the substrate and the silicon.

22 Claims, 1 Drawing Figure

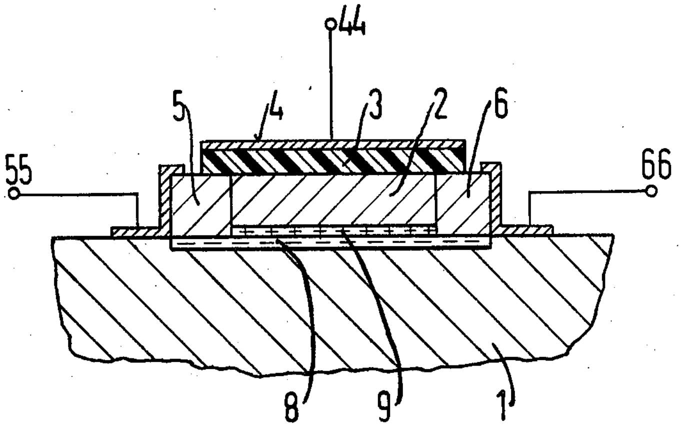
44
5
4
3
2
6
55
66
8
9
1

METHOD FOR PRODUCTION OF P-CHANNEL FIELD EFFECT TRANSISTORS AND PRODUCT RESULTING THEREFROM

BRIEF SUMMARY OF THE INVENTION

The present invention relates to the production of p-channel field effect transistors formed in silicon formed on a substrate of spinel, and to integrated circuits, including such field effect transistors.

p-Channel field effect transistors formed in semiconductor material consisting of silicon applied to a substrate consisting of spinel are known, such for example, as p-MOS circuits on spinel as well as complementary MOS(c-MOS) circuits on spinel. A disadvantage of such field effect transistors lies in the fact that in the blocked state of these transistors, a residual current is often found to flow between the source and the drain. The power consumption in such cases is relatively high in the blocked state.

It is an object of the present invention to provide a novel process for the production of p-channel field effect transistors in semiconductor material comprising forming a layer of silicon on a substrate of spinel, the residual current of which, in the blocked state, is considerably lower than the residual current which usually occurs in known p-channel field effect transistors in semiconductor material consisting of silicon on a substrate of spinel.

According to the invention, there is provided a novel process for the production of a p-channel field effect transistor in a semiconductor layer consisting of silicon on a spinel substrate, which includes the step of annealing the substrate as well as the silicon arranged thereon, in a hydrogen atmosphere after the formation of the transistor has been completed.

It is found that the power loss of p-channel field effect transistors produced in accordance with the invention is low in the blocked state.

It is a further object of the present invention to provide a novel p-channel field effect transistor having the channel, the source, and the drain regions in a layer of silicon disposed on a spinel substrate in which both the silicon and the spinel substrate are annealed.

Another and further object of the present invention is to provide a novel p-channel field effect transistor having low power losses when the transistor is in the blocked state.

THE DRAWING

The single FIGURE of the drawing is a schematic vertical sectional view of a p-channel field effect transistor produced by the novel process of the present invention.

DETAILED DESCRIPTION OF THE INVENTION

Referring to the drawing, on a spinel substrate 1, (preferably a Mg-Al spinel, such for example as Mg $Al_2$, $O_4$), a silicon layer 2 is formed. Zones 5 and 6 of this silicon layer are $p^+$-doped for forming source and drain regions. On the silicon layer 2, a gate insulator layer 3 is arranged extending between the zones 5 and 6. A control electrode 4, which preferably consists of aluminum, is applied to the gate insulator layer 3. Conductors 55 and 66 serve as electric leads to the zones 5 and 6 respectively of the silicon layer. A conductor 44 is provided for the control electrode 4.

The invention is based on the following considerations. Unless special measures are taken, in p-channel field effect transistors formed on a spinel substrate, an additional $p^+$-doped layer is found close to the spinel-silicon boundary area. This layer can be traced back to the known autodoping effect. This effect depends on the fact that during the growth of the silicon on the spinel substrate, aluminum is incorporated from the spinel into the silicon. It is possible, however, to remove the aluminum contained in the silicon during the high temperature processes required for the production of the MOS component by gettering. It was discovered, however, that residual currents still occurred in the blocked state, even after this gettering, and these can be traced back to a different effect.

Experiments made on a p-channel field effect transistor, as described above, have shown that negative charges are present in the spinel at the boundary layer between the silicon and the substrate. The zone in which these charges occur is indicated at 8 in the drawing. The presence of negative charges within the zone 8 leads to the formation of a positively charged zone 9 within the silicon body 2. This positively charged zone represents an electrical connection between the $p^+$-doped zones 5 and 6 of the silicon body. It has been found that this is the decisive cause of the residual current flowing in the blocked state of the p-channel field effect transistor.

In the process of the invention, by annealing in a hydrogen atmosphere, the concentration of the boundary area energy terminates, and thus the concentration of the charges in the zones 8 and 9, can be reduced.

The hydrogen annealing step takes place after the conclusion of the high temperature processes required for the production of the p-channel field effect transistor such as, for example, oxidation or diffusion processes.

The hydrogen annealing is preferably carried out at a temperature in the range of 300°–800°C and may be effected either before or after the application of the material forming electrodes and conductor paths. When the annealing step is carried before the application of this electrode and conductor material, it is conveniently effected at 500°–600°C for approximately 10 to 60 minutes. If the applied material is aluminum and the annealing is carried out after its application, then the annealing may conveniently be effected for approximately 10 to 60 minutes at a temperature in the range of 300°–550°C, in particular for 20 to 50 minutes at a temperature in the range of 450°–500°C in a hydrogen atmosphere. At such temperature, the formation of alloys between the aluminum and the silicon is prevented.

If the material applied to form connection electrodes, conductor paths and/or other metallic layers consists of a metal such as molybdenum, whose eutectic with silicon is formed at higher temperatures than the eutectic of aluminum with silicon, or if the electrodes or conductor paths are produced from polycrystalline silicon, the hydrogen annealing can also be carried out at above 500°C.

The annealing can be effected as the last technological step so that, in this case, it is possible to reduce the power loss which occurs in the blocked state of p-channel field effect transistors formed in silicon on a spinel substrate even in components whose construction is already complete.

Although the invention has been described in connection with the preferred embodiments, it is not to be so limited as changes and modifications may be made which are within the full intended scope of the invention as defined by the appended claims.

I claim as my invention:

1. A process for the production of a p-channel field effect transistor which includes forming a layer of silicon on a spinel substrate, forming $p^+$-source and drain regions in said silicon layer with a gate region therebetween, forming an insulating layer over said gate region and overlapping a portion of each of said source and drain regions, forming electrodes on said insulating layer and on a portion of each of said source and drain regions, at least one of the aforesaid steps being carried out at a relatively high temperature, and finally annealing said substrate and said silicon layer in a hydrogen atmosphere after all of said high temperature steps have been terminated.

2. A process as set forth in claim 1, wherein said annealing step is carried out at a temperature in the range of 300°–800°C for 10 to 60 minutes.

3. A process for the production of a p-channel field effect transistor which includes forming a layer of silicon on a spinel substrate, forming $p^+$-source and drain regions in said silicon layer with a gate region therebetween, forming an insulating layer over said gate region and overlapping a portion of each of said source and drain regions, at least one of the aforesaid steps being carried out at a relatively high temperature, annealing said substrate and said silicon layer in a hydrogen atmosphere after all of said high temperature steps have been terminated, and forming electrodes on said insulating layer and on a portion of each of said source and drain regions at a relatively low temperature.

4. A process as set forth in calim 3, wherein said annealing step is carried out at a temperature in the range of 300°–800°C for 10 to 60 minutes.

5. A process as set forth in claim 3, wherein said annealing step is carried out at a temperature in the range of 300°–800°C for 10 to 60 minutes, and in which the said annealing step is carried out before the application of material to form electrodes.

6. A process as set forth in claim 1, wherein said annealing step is carried out at a temperature in the range of 300°–800°C for 10 to 60 minutes, and wherein said annealing step is carried out after the application of material to form electrodes.

7. A process as set forth in claim 1, in which the annealing step is carried out at a temperature in the range of 300°–550°C for 10 to 60 minutes.

8. A process as set forth in claim 3, in which the annealing step is carried out at a temperature in the range of 300°–550°C for 10 to 60 minutes.

9. A process as set forth in claim 1, wherein the annealing step is carried out at a temperature in the range of 450°–500°C for 20 to 50 minutes.

10. A process as set forth in claim 3, wherein the annealing step is carried out at a temperature in the range of 450°–500°C for 20 to 50 minutes.

11. A process as set forth in claim 1, wherein said metal forming said electrodes forms a high temperature eutectic with silicon.

12. A process as set forth in claim 3, wherein said metal forming said electrodes forms a high temperature eutectic with silicon.

13. A process as set forth in claim 1, wherein said electrode material is polycrystalline silicon.

14. A process as set forth in claim 3, wherein said electrode material is polycrystalline silicon.

15. A process as set forth in claim 1, wherein said metal forming said electrodes is molybdenum.

16. A process as set forth in claim 3, wherein said metal forming said electrodes is molybdenum.

17. A process as set forth in claim 1, wherein said annealing step is carried out at a temperature above 500°C.

18. A process as set forth in claim 3, wherein said annealing step is carried out at a temperature above 500°C.

19. A process for the production of a p-channel field effect transistor in a semiconductor silicon layer on a spinel substrate, the substrate being formed of a Mg-Al material, the production of which requires at least one high temperature step which includes the step of annealing the substrate and the silicon in a hydrogen atmosphere after all of said high temperature steps have been completed.

20. A process as set forth in claim 19, in which any aluminum incorporated in said silicon layer from said spinel substrate during the growth of said layer is reduced by a high temperature process effected prior to said annealing step.

21. A process for the production of a p-channel field effect transistor in a semiconductor layer comprising silicon on a spinel substrate, including the step of annealing the substrate and the silicon arranged thereon in a hydrogen atmosphere after all the high temperature processes required in the formation of the transistor have been completed.

22. A process for the production of a p-channel field effect transistor in a semiconductor silicon layer on a spinel substrate, the production of which requires at least one high temperature step which includes the step of annealing the substrate and the silicon after all of said high temperature steps have been completed.

* * * * *